United States Patent
Mohn et al.

(10) Patent No.: US 10,079,193 B2
(45) Date of Patent: Sep. 18, 2018

(54) SEMICONDUCTOR MODULE

(71) Applicants: ABB Schweiz AG, Baden (CH); Audi AG, Ingolstadt (DE)

(72) Inventors: Fabian Mohn, Ennetbaden (CH); Jürgen Schuderer, Zürich (CH)

(73) Assignees: ABB Schweiz AG, Baden (CH); Audi AG, Ingolstadt (DE)

( * ) Notice: Subject to any disclaimer, the term of this patent is extended or adjusted under 35 U.S.C. 154(b) by 33 days.

(21) Appl. No.: 15/453,123

(22) Filed: Mar. 8, 2017

(65) Prior Publication Data
US 2017/0263527 A1 Sep. 14, 2017

(30) Foreign Application Priority Data

Mar. 8, 2016 (EP) .................................. 16159199

(51) Int. Cl.
*H01L 23/22* (2006.01)
*H01L 23/24* (2006.01)
(Continued)

(52) U.S. Cl.
CPC .......... *H01L 23/3675* (2013.01); *H01L 23/04* (2013.01); *H01L 23/3121* (2013.01); *H01L 23/3735* (2013.01); *H01L 23/49822* (2013.01); *H01L 23/49827* (2013.01); *H01L 23/49833* (2013.01); *H01L 23/49838* (2013.01); *H01L 24/49* (2013.01); *H01L 25/105* (2013.01); *H01L 2224/32225* (2013.01);
(Continued)

(58) Field of Classification Search
CPC ........... H01L 23/3121; H01L 23/49816; H01L 23/49827; H01L 23/3735; H01L 23/04; H01L 23/49822; H01L 23/49833; H01L 23/49541; H01L 23/49861
USPC ........................................................ 257/687
See application file for complete search history.

(56) References Cited

U.S. PATENT DOCUMENTS 7,983,046 B1 7/2011 Borzabadi et al.
2002/0024120 A1* 2/2002 Yoshimatsu .......... H01L 23/552
257/659
(Continued)

FOREIGN PATENT DOCUMENTS

WO 2014166692 A1 10/2014

OTHER PUBLICATIONS

European Patent Office, Extended Search Report issued in corresponding Application No. 16159199.5, dated Oct. 18, 2016, 5 pp.

*Primary Examiner* — Theresa T Doan
(74) *Attorney, Agent, or Firm* — J. Bruce Schelkopf; Taft Stettinius & Hollister LLP

(57) ABSTRACT

A semiconductor module comprises a semiconductor device; a substrate, on which the semiconductor device is attached; a molded encasing, into which the semiconductor device and the substrate are molded; at least one power terminal partially molded into the encasing and protruding from the encasing, which power terminal is electrically connected with the semiconductor device; and an encased circuit board at least partially molded into the encasing and protruding over the substrate in an extension direction of the substrate, wherein the encased circuit board comprises at least one receptacle for a pin, the receptacle being electrically connected via the encased circuit board with a control input of the semiconductor device.

20 Claims, 1 Drawing Sheet

(51) Int. Cl.
    *H01L 23/367*      (2006.01)
    *H01L 23/498*      (2006.01)
    *H01L 23/31*      (2006.01)
    *H01L 23/04*      (2006.01)
    *H01L 23/373*      (2006.01)
    *H01L 23/00*      (2006.01)
    *H01L 25/10*      (2006.01)

(52) U.S. Cl.
    CPC ............... *H01L 2224/32245* (2013.01); *H01L 2224/48091* (2013.01); *H01L 2224/48106* (2013.01); *H01L 2224/48175* (2013.01); *H01L 2224/48245* (2013.01); *H01L 2224/73265* (2013.01); *H01L 2225/1017* (2013.01); *H01L 2225/1047* (2013.01); *H01L 2225/1094* (2013.01); *H01L 2924/0665* (2013.01); *H01L 2924/1203* (2013.01); *H01L 2924/1301* (2013.01); *H01L 2924/13055* (2013.01); *H01L 2924/13091* (2013.01); *H01L 2924/186* (2013.01)

(56) References Cited

U.S. PATENT DOCUMENTS

| | | | |
|---|---|---|---|
| 2002/0036355 A1* | 3/2002 | Young | H01L 23/26 257/787 |
| 2006/0060982 A1 | 3/2006 | Ikawa et al. | |
| 2009/0146272 A1 | 6/2009 | Wieneke Kessler et al. | |
| 2012/0320645 A1 | 12/2012 | Fujino et al. | |
| 2015/0092380 A1* | 4/2015 | Hohlfeld | H05K 1/11 361/783 |

\* cited by examiner

SEMICONDUCTOR MODULE

FIELD OF THE INVENTION

The invention relates to the field of packaging of power semiconductors. In particular, the invention relates to a semiconductor module.

BACKGROUND OF THE INVENTION

Power semiconductor modules containing solid-state switching devices such as IGBTs or Power-MOSFETs are used in various power electronics applications to switch or rectify electric currents. An important and fast growing application are converter systems for electric or hybrid electric vehicles. A typical six-pack module (containing three half-bridges with two semiconductor switches) for such applications may have a voltage rating of up to 1200 V and a current rating of several 100 A.

Besides the high-current power terminals by which the power semiconductor module is connected to the AC (e.g. motor) and DC (e.g. battery) side, a six-pack or half-bridge power semiconductor module usually also has several auxiliary terminals for connection to a gate driver board that contains a driver circuit which controls the different semiconductor devices in the power semiconductor module and/or may detect fault situations. A typical six-pack power semiconductor module may have up to ten such auxiliary connections per half-bridge, that is, 30 connections for a full six-pack inverter module.

Technologies commonly used for auxiliary terminal connections are screw connections, solder pin connections and press-fit connections.

Another preferred solution especially for automotive power modules is epoxy mold encapsulation, which can have benefits in terms of high-temperature capability, humidity resistance, cost, and high-volume manufacturability.

Unfortunately, the common epoxy molding processes for such semiconductor encapsulation (transfer and epoxy molding) are not compatible with pins sticking out vertically from the power semiconductor module as in the housing-based power semiconductor modules.

Transfer-molded power modules with lead-frame terminals for power and auxiliary connections on the side of the module usually have rather long auxiliary connections, which may imply larger inductances and less favorable switching behavior. Furthermore, if a single lead frame is to be used for both power and auxiliary terminals (which has advantages regarding the manufacturing of the power module), then expensive press-fit material such as CuNiSi has to be used also for the power terminals, which otherwise could be made of cheaper copper material.

WO 2014 166692 A1 and US 2009 146272 A1 show a semiconductor module with receptacles for press-fit pins molded into a top side of a molded encasing.

DESCRIPTION OF THE INVENTION

It is an objective of the invention to provide an easy and economical to manufacture a semiconductor module.

This objective is achieved by the subject-matter of the independent claim. Further exemplary embodiments are evident from the dependent claims and the following description.

The invention relates to a (power) semiconductor module. A semiconductor module may be seen as a device, which comprises one or more (power) semiconductor devices (such as diodes, transistors, thyristors) together with further members mechanically supporting and electrically interconnecting these one or more semiconductor devices. A power semiconductor module as well as a power semiconductor device may be adapted for processing currents of more than 10 A and/or more than 100 V.

The semiconductor module may be used in automotive applications, such as passenger cars, motorbikes, busses, trucks and/or charging stations. Furthermore, the semiconductor module may be used in all other kinds of vehicles, such as (off-road) construction vehicles.

According to an embodiment of the invention, the semiconductor module comprises a semiconductor device; a substrate, on which the semiconductor device is attached; a molded encasing, into which the semiconductor device and the substrate are molded; at least one power terminal partially molded into the encasing and protruding from the encasing, which power terminal is electrically connected with the semiconductor device; and an encased circuit board at least partially molded into the encasing and protruding over the substrate in an extension direction of the substrate, wherein the circuit board comprises at least one receptacle for a pin, the receptacle being electrically connected via the circuit board with a control input of the semiconductor device.

The semiconductor device may be or may comprise one or more semiconductor switches (such as a thyristors or transistors), which may be provided on one or more chips. Usually, a semiconductor device/chip has a planar body and/or is bonded (for example soldered or sintered) with one side to the substrate.

The power semiconductor device may comprise a flat body which provides electrical contact areas or electrical contact inputs on a top side or on opposite top and bottom sides. It has to be noted that the terms "bottom side" and "top side" do not specify a direction with respect to the earth surface, but merely describe opposite sides.

The substrate may comprise a metallization layer (i.e. an electrically conducting layer), to which the semiconductor device is attached and an isolation layer (such as a plastics layer or a ceramics layer) onto which the metallization layer is supported. The metallization layer of the substrate may be structured to provide electrical paths from and to the semiconductor device. The substrate may be substantially planar and the extension of the substrate in a corresponding plane may define an extension direction of the substrate.

The substrate may have a further metallization layer opposite to the first metallization layer, which, for example, may be attached or bonded to a baseplate for dissipating heat.

The at least one power terminal may be provided by a lead frame or other metal strip, which may be attached (for example bonded) to the substrate. The at least one power terminal may be electrically connected to areas/inputs of the semiconductor device, through which currents flow that are switched by the semiconductor device. Such areas may be collector and emitter areas/inputs or source and drain areas/inputs.

In general, power terminals may provide AC and DC inputs of the semiconductor module.

The circuit board for providing the at least one receptacle may be a printed circuit board. The circuit board may comprise one or more (optionally structured) metallization layers and isolation layers, which are laminated together. Also the circuit board may be attached (for example bonded) to the substrate. The circuit board and in particular one of its metallization layers may be electrically connected to a control area/input of the semiconductor device, which may be a base area/input or a gate area/input.

In general, the circuit board may provide more than one receptacle providing further auxiliary connections of the semiconductor module.

The molded encasing may be epoxy molded, for example in a press with two press tools, in which the substrate, the attached semiconductor device, the already electrically connected power terminal(s) and the already electrically connected circuit board are placed and surrounded with epoxy under pressure. It has to be noted that the power terminal(s) and/or the circuit board also may be mechanically connected to the substrate before molding. However, it also may be possible that the circuit board is mechanically connected to the substrate (solely) via the molded encasing.

Usually, the molded encasing as well as the semiconductor module may have a substantially planar body with a top face and a bottom face, which are surrounded by sides of the substantially planar body. The power terminal(s) and the circuit board may protrude from this body from the sides. In such a way, the protruding parts of the power terminal(s) and the circuit board may be arranged between the above mentioned press tools without a further need for securing electrical connections protruding from the top or bottom face.

On the protruding part of the circuit board, one or more receptacles are provided, which are adapted for receiving a pin for electrically connecting a further circuit with the semiconductor device. The receptacle may be a hole (a through-hole or a hole with a bottom), which may be at least partially covered with metal, which is electrically connected with a metallization layer of the circuit board. The pin may be provided by an external (control) circuit board, which is attached to the top side of the semiconductor module. The control circuit board may be a gate driver board. It has to be understood that a gate driver board also may be used for controlling the base of a bipolar transistor.

The semiconductor module provides a way of easily epoxy molding the electrical and mechanical parts into an encasing, without generating problems, when electrically connecting the semiconductor module to further devices.

Additionally, the semiconductor module provides a cost effective solution, because transfer mold encapsulation is a cost-effective process for volume production, no expensive plastic-metal composite frame parts are needed, and the assembly of the semiconductor module with an external circuit board is simplified.

According to an embodiment of the invention, the semiconductor module comprises an external circuit board attached to the encasing, the external circuit board carrying a control circuit for the semiconductor device. The external circuit board, which may be a control circuit board for the semiconductor device inside the molded encasing, may be arranged outside of the molded encasing. For example, the external circuit board may be attached to the top face of the semiconductor module and one or more pins provided by the external circuit board may be placed into the one or more receptacles.

Furthermore, the short current path between the external circuit board and the encased circuit board (via the pin) as well as the parallel current path through the external circuit board and the encased circuit board (via metallization layers of the two circuit boards) may enable a low-inductance gate or base connection, which may be important to enable fast switching and/or minimize inductive coupling between the semiconductor device and the control circuit.

According to an embodiment of the invention, the external circuit board comprises a press-fit pin pressed into the receptacle. A press-fit pin may be a pin with an end that may be reversible or irreversible compressed, when pressed into the receptacle. For example, the pin may have an end with at least two fingers that are compressed towards each other, when the end of the pin is inserted into the receptacle.

The other end, at which the pin is interconnected with the external circuit board, also may be an end adapted for press-fit connection, for example into a further receptacle in the external circuit board. However, it is also possible that the press-fit pin is soldered to or into the external circuit board.

The combination of an epoxy mold encapsulation and a press-fit interconnection within the semiconductor module enables the operation of the semiconductor module in demanding temperatures, high load cycling, and/or high vibrations. Thus, the semiconductor module is well suited for housing or being part of an electrical inverter for an (hybrid) electric vehicle.

According to an embodiment of the invention, the receptacle is a hole through the circuit board, which hole is at least partially coated with a metallization layer. This hole may be provided outside of the molded encasing.

According to an embodiment of the invention, the receptacle is adapted for receiving a press-fit pin. A press-fit connection may provide high reliability, high-temperature capability and ease of assembly. A press-fit connection may comprise a pin with a deformable tip that is inserted with force into a plated through-hole (the receptacle) in the circuit board to form a hermetic and permanent electrical connection. The pin and/or the receptacle may be Sn-plated.

According to an embodiment of the invention, the receptacle is oriented in a direction substantially orthogonal to a direction in which the substrate is orientated. The substrate may comprise multiple layers, each of which may have a planar extension. The receptacle or the corresponding hole may be oriented substantially orthogonal to the planes defined by the layers of the substrate, i.e. may point in a direction from the bottom side to the top side of the molded encasing.

This may result in a press-fit pin sticking out vertically from the semiconductor module besides the molded encasing, which may be assembled after the molding process. The semiconductor module may not need a plastic frame and may be encapsulated using a transfer molding process.

According to an embodiment of the invention, the encasing comprises protrusions, adapted for mounting an external circuit board. These protrusions, which may be seen as plastics pins, may be one-piece with the body of the encasing and/or may be formed during the molding of the encasing. In general, the molded encapsulation may feature a guiding structure for mounting the external circuit board to the power semiconductor module.

The protrusions may be used for mounting the external circuit board on the semiconductor module together with the press-fit connection provided by the one or more pins and the one or more receptacles. The external circuit board may comprise holes for receiving the protrusions. The plastics protrusions may be press-fit into these holes during assembly of the external circuit board and the molded encasing. A high alignment accuracy between the external circuit board and the semiconductor module-side circuit board is achieved in a simple way.

According to an embodiment of the invention, the protrusions and the at least one receptacle are oriented in the same direction. The protrusions may protrude from the top face of the encasing on the same direction as the one or more receptacles and/or the corresponding pins.

According to an embodiment of the invention, the encased circuit board is a multi-layer circuit board, comprising at least two electrically conducting layers, which may be isolated from each other via isolating layers. Through his different layers, one or more gate or base signals may be conducted as well as one or more auxiliary signals, which, for example, may be provided by one or more sensors (such as a temperature sensor, a current sensor and/or a voltage sensor). These one or more sensors also may be encapsulated into the mold encasing and electrically connected with the encased circuit board.

In this way, a gate or base connection with very low inductance may be provided, if the respective gate and auxiliary signals are routed in parallel planar layers in the multilayer circuit board. This can enable increased switching speeds and reduced couplings between power and auxiliary signals, which is especially important for wide-bandgap power semiconductor devices.

According to an embodiment of the invention, the encased circuit board comprises at least two receptacles electrically connected to different electrically conducting layers of the encased circuit board. It may be possible that the different electrically conduction layers are interconnected with vias. Each of the auxiliary connections of the semiconductor module may be provided by a high-reliability press-fit connection, which may connect the semiconductor module with the external circuit board and/or which are compatible with a transfer-molding encapsulation process.

This may also enable a reduced substrate and semiconductor module footprint based on multilayer signal routing through the encased circuit board. For example, the encased circuit board may be attached on a power signal-carrying island on the substrate. No separate pads in the substrate metallization layer may be needed for the auxiliary signals, by a direct wire bond connection to a metallization layer of the encased circuit board.

Furthermore, the encased circuit board part may make additional ceramic substrates obsolete that otherwise may be needed to provide low-inductive gate signal distribution in the semiconductor module.

According to an embodiment of the invention, the semiconductor device comprises a semiconductor switch adapted for switching a current through the power terminal and adapted for being controlled by the control input. As already mentioned, the semiconductor device may comprise one or more thyristors and/or transistors. For example, the semiconductor device may comprise a half-bridge.

According to an embodiment of the invention, the encasing comprises a mold structure protruding from a main body of the encasing, in which the encased circuit board is mechanically supported. The mold structure may mechanically support the circuit board structure. The mold structure may have slant sides, which from the top side and/or bottom side of the semiconductor module run towards the encased circuit board.

According to an embodiment of the invention, the encased circuit board is encased in a mold structure protruding from a main body of the encasing, the mold structure comprising holes aligned with the receptacles. In other words, the encasing and in particular the mold structure may completely cover the encased circuit board and only may have holes such that the press-fit pins may be pressed into the encased circuit board.

However, it also may be possible that the circuit board is only partially encased and protrudes from the molded encasing.

According to an embodiment of the invention, the substrate is an insulated metal substrate comprising two metallization layers insulated by an electrically isolating layer. The semiconductor device or at least parts of it may be bonded to the substrate and in particular to one of the metallization layers.

According to an embodiment of the invention, the encased circuit board is attached (for example bonded) to the substrate. The encased circuit board may be mechanically supported by the substrate, to which it may be attached for example by means of soldering, sintering, glueing, directly or with spacers in between.

According to an embodiment of the invention, the at least one power terminal is attached (for example bonded) to the substrate. The at least one power terminal and/or the lead frame providing the at least one power terminal may be mechanically supported by the substrate, to which it may be attached for example by means of soldering, sintering, glueing, directly or with spacers in between.

According to an embodiment of the invention, the at least one power terminal and the encased circuit board protrude from the semiconductor module in a sideward direction, in which the substrate is orientated. The at least one power terminal and the encased circuit board may protrude from sides of the body of the encasing. The substrate, the encased circuit board and/or the at least power terminal are orientated in the same direction.

According to an embodiment of the invention, the encased circuit board is connected with at least one wire bond molded into the encasing. For example, the at least one wire bond is connected to the semiconductor device and/or to a metallization layer of the substrate. The encased circuit board may be interconnected by wire bonds to one or more semiconductor chips of the semiconductor device in the semiconductor module or to contact pads on the substrate. These wire bonds may be bonded to their contact faces before the molding and then completely molded into the encasing.

According to an embodiment of the invention, the semiconductor module further comprises a baseplate in thermal contact with the semiconductor device, partially molded into the encasing and protruding from the encasing. The baseplate may be metal plate thicker than the one or more metallization layers of the substrate and/or may be electrically isolated from the semiconductor device. The baseplate may be bonded to the substrate, i.e. mechanically connected to the substrate before the molding.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

Figure 1:
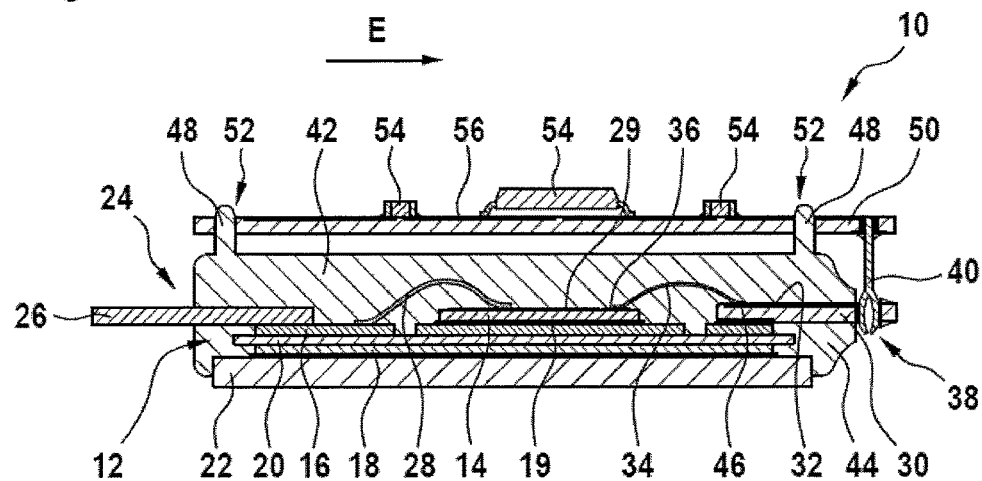
FIG. 1 schematically shows a cross-sectional view through a semiconductor module according to an embodiment of the invention.

The reference symbols used in the drawings, and their meanings, are listed in summary form in the list of reference

DETAILED DESCRIPTION OF EXEMPLARY EMBODIMENTS

FIG. 1 shows a semiconductor module 10, which comprises a substrate 12, onto which a semiconductor device 14 is attached.

The substrate 12 may be an insulated metal substrate comprising two metallization layers 16, 18, which are attached to an isolation layer 20, which may be a ceramics layer. The semiconductor device 14, which may be a semiconductor chip with a transistor or thyristor, may be bonded with a bottom side to the metallization layer 16.

At this bottom side of the semiconductor device 14, a power input 19 of the semiconductor device 14 may be provided, which may be a drain area or a collector area.

The top metallization layer 16 of the substrate 12 may be structured to provide electrically conducting paths for the semiconductor device 14.

A baseplate 22 may be attached to the bottom metallization layer 18 of the substrate 12, for example by bonding, This baseplate 22, which may be a metal plate thicker than the metallization layers 16, 18, may be electrically isolated from the semiconductor device 14 but in thermal contact with the semiconductor device 14 for cooling the semiconductor device 14.

The semiconductor module 10 furthermore comprises power terminals 24, which are provided by a lead frame 26, which is attached (for example bonded) to the top metallization layer 16 of the substrate 12. A power terminal 24 may be provided by a metal strip. As shown in FIG. 1, the part of the top metallization layer 16 bonded to the power terminal 24 is connected via a wire bond 28 with a further power input 29 of the semiconductor device 14 provided on the top side of the semiconductor device 14. This power input 29 may be a source area or an emitter area. The part of the top metallization layer 16 bonded to the semiconductor device 14 may be electrically connected (either directly or indirectly via a further wire bond) with a further power terminal 24 provided by the lead frame 26.

With respect to an extension direction E of the semiconductor module 10, a circuit board 30 is attached (for example bonded) to a further part of the top metallization layer 16. A metallization layer 32 of the circuit board 30 is electrically connected via a wire bond 34 with a control input 36 of the semiconductor device 14 provided on the top side of the semiconductor device 14. This control input 36 may be a base area or gate area.

The circuit board 30 comprises one or more receptacles 38, which are holes that protrude through the circuit board 30 and that are adapted for receiving a press-fit pin 40. Each receptacle 38 may be coated with a metal layer and/or may be a plated hole, which is electrically connected to a metallization layer 32 of the circuit board 30.

With respect to the extension direction E, the circuit board 30 and in particular a part with the receptacles 38 protrudes over the substrate 12.

The semiconductor module 10 comprises a molded encasing 42 in which the substrate 12, the semiconductor device 14 and the wire bonds are completely encased. The power terminals 24 and the lead frame 26 may protrude from the encasing 42 in a sideward way.

The circuit board 30 also may protrude from the encasing 42 in a sideward way or may be covered by the encasing 42. While the side of the encasing 42 from which the power terminals 24 protrude may be substantially planar, the side of the encasing at which the circuit board 30 is situated may have a mold structure 44, which protrudes from a main body 46 of the encasing 42, in which the circuit board 30 is at least partially received.

This mold structure 44 for mechanically supporting the circuit board 30 may completely or at least partially cover the circuit board 30. The mold structure 44 may have holes aligned with the receptacles 38 through which the press-fit pin 40 may reach.

The baseplate 22 may protrude from the encasing 42 from a bottom side of the main body 46 of the encasing 42.

On a top side, the encasing 42 may have pins 48, which may protrude from the main body 46 substantially orthogonal to the direction E.

The complete encasing 42, i.e. the main body 46, the mold structure 44 and the protrusions may be formed during one molding process. For example, the completely assembled parts 12, 14, 22, 26, 28, 30, 34 may be positioned in a two-part mold tool and may be encased into epoxy material under pressure.

The pins 48 are used for attaching an external circuit board 50 to the encasing 42 of the semiconductor module 10. The external circuit board 50 may have holes 52 for receiving the pins 48, in which the pins 48 may be supported by friction fit.

The external circuit board 50, which also may be oriented in the direction E, i.e. substantially parallel to the substrate 12, the lead frame 26 and the internal, encased circuit board 30, may carry a control circuit of the semiconductor device 14, such as a gate driver. FIG. 1 shows some electronic components 54 of this control circuit, which may be bonded to a metallization layer 56 of the external circuit board 50.

The press-fit pin 40 may be soldered to the external circuit board 50 and may protrude substantially orthogonal from the external circuit board 50. When the external circuit board 50 is mounted to the encasing 42, the press-fit pin 40 may be pressed into the receptacle 38. At its end, the press-fit pin 40 may comprise a structure similar to a needle eye that may be compressed during the mounting, such that the press-fit pin 40 has good mechanical and electrical contact in the receptacle 38 after the mounting. It has to be noted that the press-fit pin 40 runs besides the main body 46 of the encasing 42.

In contrast to the conventional press-fit connection approach with male pins coming out vertically of a semiconductor module to be connected to a female part in a circuit board, the press-fit pin 40 may be integrated in the external circuit board 50 and may make a connection to a female part (the receptacle 38) in the semiconductor module 10. The internal circuit board 30, which provides the one or more receptacles 38, is integrated into the mold encasing 42. The receptacles 38 may be exposed holes for the press-fit pins 40.

The internal circuit board 30 may be mechanically bonded to the substrate 12 (for example by means of soldering, sintering, or glueing) and/or may be interconnected by wire bonds 34 either directly to contact areas 36 on the semiconductor device 14 and/or to contact pads on the substrate 12.

Alternatively, contact pads of the internal circuit board 30 may also be directly electrically connected to contact pads of the substrate 12. For example, electrically conducting vertical vias may distribute electrical signals in the circuit board 30.

Alternative solutions how to integrate the circuit board 30 in the semiconductor module 10 include attachment of the internal circuit board 30 to a baseplate 22, having the circuit board 30 vertically displaced from the substrate 12 by using some kind of spacer between the substrate 12 and the circuit board 30, or even having the circuit board 30 part "free-floating" and only fixed by the molded encasing 42 (which may be achieved using a temporary fixation for the wire bonding during molding).

The molded encasing 42, which may be seen as an encapsulation, may be epoxy molded with a transfer molding process, because no leads or pins are vertically sticking out of the semiconductor module 10. A mold tool may directly align to the edge of the circuit board 30, by which a high relative position accuracy between alignment features 48 of the external circuit board 50 (for example formed as protrusions or holes in the mold encapsulation, or additional parts) and the press-fit receptacles 38 in the circuit board 30 may be achieved.

The press-fit pin 40 may be already integrated in the external circuit board 50. This may be achieved by any commonly used connection method such as soldering in a through-hole or also by an additional press-fit connection. An external circuit board 50 with integrated press-fit pin 40 may be press-fit mounted to the semiconductor module 10 using the alignment features 48 and optionally some screw connections. In general, the external circuit board 50 may be mounted directly to the semiconductor module 10 or to an additional frame structure surrounding the semiconductor module 10.

Figure 2:
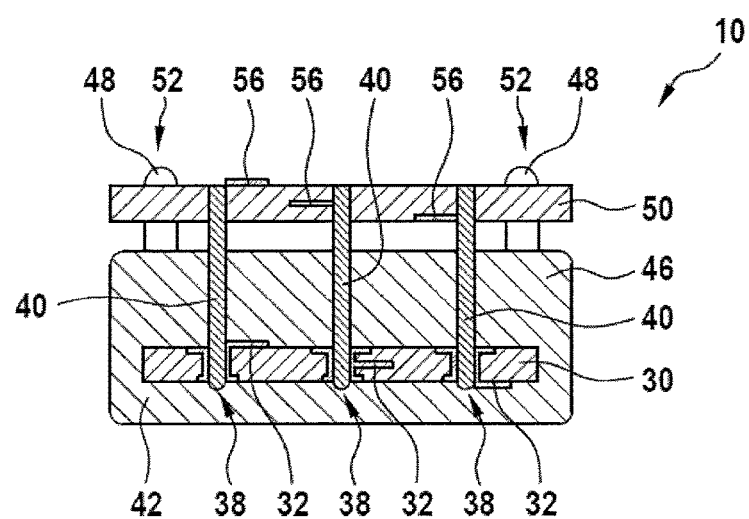
FIG. 2 schematically shows a cross-sectional view through a semiconductor module according to a further embodiment of the invention.

FIG. 2 shows a view from a power semiconductor module 10, such as the one from FIG. 1, from another side. FIG. 2 shows that both circuit boards 30, 50 may be multi-layered circuit boards.

The encased circuit board 30 may have several receptacles that are connected to different metallization layers 32 of the circuit board 30. In such a way, multiple electrical signals may be routed in multiple conducting metallization layers. For example, these signals include control signals from the external circuit board 50 and sensor signals from sensors that may be encased into the molded encasing 42.

On the other hand, the external circuit board 50 may provide several press-fit pins 40 that are connected to different metallization layers 56 of the circuit board 50.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 semiconductor module
12 substrate
14 semiconductor device
16 top metallization layer
18 bottom metallization layer
19 contact area
20 isolation layer
22 baseplate
24 power terminal
26 lead frame
28 wire bond
29 contact area
30 circuit board
32 metallization layer
34 wire bond
36 contact area
38 receptacle
40 press-fit pin
42 molded encasing
44 protruding mold structure
46 main body
48 pin
50 external circuit board
52 hole
54 electronic component
56 metallization layer

The invention claimed is:

1. A semiconductor module, comprising:
a semiconductor device;
a substrate, on which the semiconductor device is attached;
a molded encasing, into which the semiconductor device and the substrate are molded;
at least one power terminal partially molded into the encasing and protruding from the encasing, which power terminal is electrically connected with the semiconductor device;
an encased circuit board at least partially molded into the encasing and protruding over the substrate in an extension direction of the substrate,
wherein the encased circuit board comprises at least one receptacle for a pin, the receptacle being electrically connected via the encased circuit board with a control input of the semiconductor device.

2. The semiconductor module of claim 1, further comprising:
an external circuit board attached to the encasing, the external circuit board carrying a control circuit for the semiconductor device;
wherein the external circuit board comprises a press-fit pin pressed into the receptacle.

3. The semiconductor module of claim 1,
wherein the receptacle is a hole through the circuit board at least partially coated with a metallization layer; and/or
wherein the receptacle is adapted for receiving a press-fit pin; and/or
wherein the receptacle is oriented in a direction orthogonal to a direction in which the substrate is orientated.

4. The semiconductor module according to claim 1,
wherein the encasing comprises protrusions, adapted for mounting an external circuit board.

5. The semiconductor module according to claim 1,
wherein the protrusions and the at least one receptacle are oriented in the same direction.

6. The semiconductor module according to claim 1,
wherein the encased circuit board is a multi-layer circuit board, comprising at least two electrically conducting layers; and/or wherein the encased circuit board comprises at least two receptacles electrically connected to different electrically conducting layers of the encased circuit board.

7. The semiconductor module according to claim 1, wherein the semiconductor device comprises a semiconductor switch adapted for switching a current through the power terminal and adapted for being controlled by the control input.

8. The semiconductor module according to claim 1, wherein the encasing comprises a mold structure protruding from a main body of the encasing, in which the encased circuit board is mechanically supported; and/or wherein the encased circuit board is encased in a mold structure protruding from a main body of the encasing, the mold structure comprising holes aligned with the receptacles.

9. The semiconductor module according to claim 1, wherein the substrate is an insulated metal substrate comprising two metallization layers insulated by an electrically isolating layer.

10. The semiconductor module according to claim 1, wherein the semiconductor device is bonded to the substrate.

11. The semiconductor module according to claim 1, wherein the encased circuit board is attached to the substrate.

12. The semiconductor module according to claim 1, wherein the at least one power terminal is attached to the substrate.

13. The semiconductor module according to claim 1, wherein the at least one power terminal and the circuit board protrude from the semiconductor module in a sideward direction, in which the substrate is orientated; and/or
wherein the substrate, the encased circuit board and/or the at least one power terminal are orientated in the same direction.

14. The semiconductor module according to claim 1, wherein the encased circuit board is connected with at least one wire bond molded into the encasing; and/or wherein the at least one wire bond is connected to the semiconductor device and/or to a metallization layer of the substrate.

15. The semiconductor module according to claim 1, further comprising:
a baseplate in thermal contact with the semiconductor device, partially molded into the encasing and protruding from the encasing, and/or
wherein the baseplate is bonded to the substrate.

16. The semiconductor module of claim 2, wherein the receptacle is a hole through the circuit board at least partially coated with a metallization layer; and/or
wherein the receptacle is adapted for receiving a press-fit pin; and/or
wherein the receptacle is oriented in a direction orthogonal to a direction in which the substrate is orientated.

17. The semiconductor module according to claim 16, wherein the encasing comprises protrusions, adapted for mounting an external circuit board;
wherein the protrusions and the at least one receptacle are oriented in the same direction; and
wherein the encased circuit board is a multi-layer circuit board, comprising at least two electrically conducting layers; and/or
wherein the encased circuit board comprises at least two receptacles electrically connected to different electrically conducting layers of the encased circuit board.

18. The semiconductor module according to claim 1, wherein the substrate is an insulated metal substrate comprising two metallization layers insulated by an electrically isolating layer;
wherein the semiconductor device is bonded to the substrate;
wherein the encased circuit board is attached to the substrate; and
wherein the at least one power terminal is attached to the substrate.

19. The semiconductor module according to claim 17, wherein the substrate is an insulated metal substrate comprising two metallization layers insulated by an electrically isolating layer;
wherein the semiconductor device is bonded to the substrate;
wherein the encased circuit board is attached to the substrate;
wherein the at least one power terminal is attached to the substrate; and
wherein the encased circuit board is connected with at least one wire bond molded into the encasing; and/or
wherein the at least one wire bond is connected to the semiconductor device and/or to a metallization layer of the substrate.

20. The semiconductor module according to claim 2, wherein the encased circuit board is a multi-layer circuit board, comprising at least two electrically conducting layers; and/or
wherein the encased circuit board comprises at least two receptacles electrically connected to different electrically conducting layers of the encased circuit board;
wherein the semiconductor device comprises a semiconductor switch adapted for switching a current through the power terminal and adapted for being controlled by the control input; and
a baseplate in thermal contact with the semiconductor device, partially molded into the encasing and protruding from the encasing, and/or
wherein the baseplate is bonded to the substrate.

* * * * *